Figure 1:
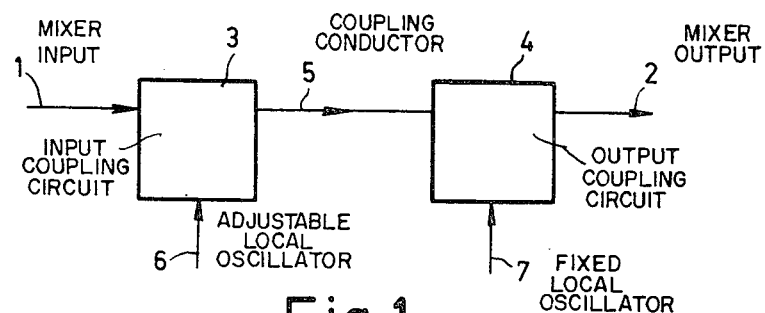

United States Patent
Lohn

[11] 3,947,782
[45] Mar. 30, 1976

[54] DIODE RING MIXER

[75] Inventor: Klaus Lohn, Walhorn, Belgium

[73] Assignee: U. S. Philips Corporation, New York, N.Y.

[22] Filed: Oct. 17, 1974

[21] Appl. No.: 515,451

[30] Foreign Application Priority Data
Oct. 30, 1973 Germany............................ 2354262

[52] U.S. Cl............ 332/29 M; 307/321; 321/69 W; 321/69 NL; 325/446; 325/448; 332/47; 332/51 R; 332/51 W; 333/1.1; 333/24.1; 333/73 R; 333/73 S
[51] Int. Cl.².................... H03D 7/02; H04B 1/26
[58] Field of Search.. 332/51 R, 51 W, 51 H, 29 M, 332/47; 329/116, 200, 166; 307/321; 333/1.1, 24.1, 73 R, 73 S, 73 C; 325/442, 446, 448; 321/69 R, 69 W, 69 NL

[56] References Cited
UNITED STATES PATENTS

| | | | |
|---|---|---|---|
| 3,247,471 | 4/1966 | Buschbeck | 333/24.1 X |
| 3,435,385 | 3/1969 | Cohen | 333/73 |
| 3,436,683 | 4/1969 | Rogers | 332/47 |
| 3,512,090 | 5/1970 | Moun | 325/442 |
| 3,562,651 | 2/1971 | Hoover et al. | 333/1.1 X |

OTHER PUBLICATIONS

Tokheim et al. – "The Four–Port YIG Filter" – The Microwave Journal, Sept. 1970, pp. 68, 69, 70.

Primary Examiner—Siegfried H. Grimm
Attorney, Agent, or Firm—Frank R. Trifari; George B. Berka

[57] ABSTRACT

A diode ring mixer in which a coupling loop between two ferrite spheres is constructed as a double conductor. The coupling loops for the symmetrical input and symmetrical output are branched off in a coupling space halfway their line length.

2 Claims, 3 Drawing Figures

DIODE RING MIXER

The invention relates to a diode ring mixer comprising four diodes which are series connected in a closed ring, two non-adjacent junctions of the diodes being connected, via a first pair of conductors, to a signal source, the other pair of non-adjacent junctions being connected, via a second pair of conductors, to an oscillator, one of the two conductor pairs being coupled to a ferromagnetic filter such that the two conductors are symmetrically arranged with respect to a symmetry plane of a body of high-frequency gyromagnetic material, the body being magnetically prepolarized with an intensity such that magnetic resonance occurs in the material and that the body is magnetically coupled to an output line perpendicular to both conductors.

A mixer of this kind is used, for example, as a mixing stage in radio receivers or television receivers. However, the known mixer requires an electrically fully symmetrical local oscillator capable of supplying balanced signal voltages of very high frequency over the entire tuning range. This necessitates a complex construction of the oscillator.

The invention has for its object to provide a particularly simple construction of the mixer of the kind set forth in the form of a high-frequency band-pass filter, in which notably an oscillator having a comparatively simple construction can be used.

The mixer according to the invention is characterized in that the gyromagnetic body is prepolarized parallel to a plane through the conductor and perpendicular to the said symmetry plane...

One embodiment of the device according to the invention will be described in detail hereinafter with reference to the drawing.

Figure 2:
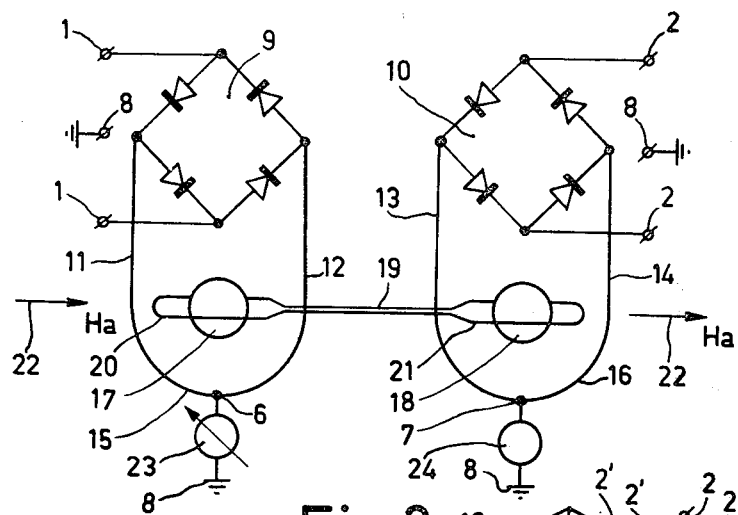
Figure 3:
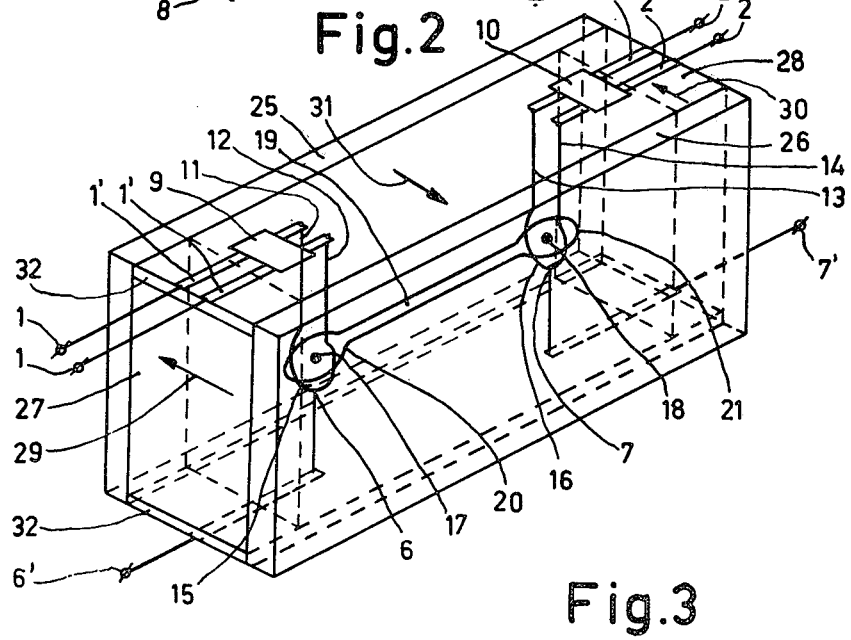

FIG. 1 diagrammatically shows the diode ring mixer according to the invention,

FIG. 2 shows the circuit of the diode ring mixer according to the invention, and FIG. 3 shows a spatial construction of the diode ring mixer according to the invention by way of example.

In FIG. 1, point 1 of an input circuit receives an input signal having a frequency of, for example, between 59 MHz and 200 MHz, which is transposed to a frequency to be transmitted, for example, in this case the 35 MHz intermediate frequency of a television receiver. This intermediate frequency can be taken off again in an output circuit at point 2. The blocks 3 and 4 diagrammatically represent coupling spaces which are interconnected by a coupling conductor 5. In the coupling space 3 a voltage from a local oscillator having a frequency of, for example, between 2000 MHz and 2900 MHz, is applied in the direction of the current path 6, and in the coupling space 4 a voltage from another local oscillator having a frequency of, for example, 2 GHz, is applied in the direction of the current path 7. The oscillator frequency for the current path 6, for example, may be adjustable, while the voltage applied to the current path 7 may have a fixed oscillator frequency.

FIG. 2 shows further details. The input side is again denoted by 1. At this point the input signal is applied as an odd signal, i.e. a signal whose currents are in phase-opposition in the two conductors of a conductor pair. The third conductor, which can be realised i.e. by the common reference point, for 1 example, earth is denoted by 8. As already shown in FIG. 1, the intermediate frequency signal can be taken off again as an odd signal at point 2. The third conductor is again the common reference point, for example earth, and is again denoted by 8. In this embodiment a first conductor pair and a second conductor pair 2 are constructed as microstrip lines which are connected between two non-adjacent junctions of a diode ring mixing circuit 9 in the input circuit, and between two non-adjacent junctions of a diode ring mixing circuit 10 in the output circuit. The other conductor pairs, corresponding to the other non-adjacent junctions of the diode ring mixing circuits 9 and 10 and comprising the conductors 11 and 12 in the input circuit and the conductors 13 and 14 in the output circuit, are constructed partly as microstrips and partly as round conductors arranged in the interior of a housing of a high-frequency ferromagnetic filter, referred to hereinafter as band-pass filter, the ends of the said conductors situated in the housing forming a coupling loop which is denoted by 15 for the input circuit and by 16 for the output circuit. These coupling loops are situated in the coupling spaces, as will yet be described with reference to FIG. 3, around the coupling bodies 17 and 18, respectively, the conductors 11 and 12, and 13 and 14 being symmetrically arranged with respect to a symmetry plane of the body 17 and 18, respectively. This coupling body is a body of gyromagnetic material, for example, a YIG sphere. Also provided around the YIG spheres in the coupling space is an output line 19. Between the two coupling spaces this coupling line 19 consists of two conductors in the form of a double line, the ends of this double line being interconnected by a loop on each side. This loop is denoted in the input circuit by 20, and by 21 in the output circuit. These loops are arranged about the coupling bodies 17 and 18 such that the two conductors are symmetrically arranged with respect to the coupling bodies 17 and 18 and are perpendicular to the conductors 11 and 12, and 13 and 14, respectively, to be coupled, a polarizing magnetic direct voltage field, denoted by $H_a$, being present in the plane of the loops 20 and 21, the said field being denoted by the arrows 22 at the left and the right in FIG. 2 and having an intensity such that gyromagnetic resonance occurs at the operating frequency.

The current paths which are symbolically denoted by 6 and 7 in FIG. 1 are the connections 6 and 7 in FIG. 2, because the oscillator frequencies, for example, of the tunable oscillator 23 in the input circuit and of the fixed oscillator 24 in the output circuit, are applied thereto, i.e. halfway the loop formed by the conductors 11 and 12, and 13 and 14, respectively, each of which is situated in one of the coupling spaces. The reference 8 denotes the common reference points for the oscillator voltages which correspond to the described reference points 8. It will be obvious that the oscillator voltages are asymmetrically applied, i.e. as an even signal which is a signal whose currents are in phase in the two conductors of a conductor pair, the intermediate frequency voltage being applied as an odd signal and also being taken off as an odd signal.

FIG. 3 shows an embodiment of a construction according to the invention. The said connections 1 of the input circuit are shown at the left in FIG. 3, whilst the outputs 2 for the intermediate frequency voltage are shown at the right top in FIG. 3. The conductor parts constructed as microstrips are denoted by 1' in the input circuit, and by 2' in the output circuit, whilst the conductors to be coupled and entering the housing, being perpendicular to the microstrip conductors, are denoted by 11 and 12 in the input circuit and by 13 and 14 in the output circuit in accordance with FIG. 2. The ends of these conductors are connected to the loop-shaped parts situated in the coupling space. This loop-shaped part constitutes the connection between the conductors 11 and 12 and is again denoted by 15 in the input circuit and by 21 in the output circuit. The coupling bodies also have the same references; 17 is the coupling body in the input circuit and 18 is the coupling body in the output circuit. The double coupling line is again denoted by 19 and again comprises the two loops 20 and 21 on its ends. The connection points for the oscillator voltage are again denoted by 6 in the input circuit and by 7 in the output circuit, whilst the corresponding terminals are denoted by 6' and 7', respectively. FIG. 3 also shows the circuit for the polarizing magnetic field. This circuit comprises the two pole plates 25 and 26 between which the permanent magnets 27 and 28 which interconnect the two ends of the pole plates are arranged. These permanent magnets 27 and 28 have magnetic fields, the directions of which are denoted by the arrows 29 and 30, with the result that in the coupling space a polarising magnetic direct voltage field having a direction as denoted by the arrow 31 is present. The microstrip lines are provided on a substrate, for example, of $Al_2O_3$. This substrate is denoted by 32. For the sake of clarity, this Figure does not show that on the substrates 32 a metal layer is provided, each time on the side facing inwards, the said layer constituting an electrode having a large surface area and being deposited on the substrate 32, for example, by metallization. These substrates are furthermore provided with passages for the conductors 11, 12, 13, 14, and 6 and 7, respectively.

As already stated, a diode ring mixer of this kind operates in the GHz range. The mixing signal, representing the frequency-shifted input signal, is symmetrically derived, i.e. in phase-opposition, from the diode ring mixer 9 in the input circuit and is applied to the first coupling space, and is subsequently symmetrically aplied, i.e. in phase-opposition, to the second coupling space in the output circuit, whilst the voltage of the oscillator signal, in accordance with the invention, is asymmetrically applied, i.e. in phase, to the relevant coupling space of the YIG filter, the YIG filter coupling only the signal in phase-opposition (odd signal), because the direction of the polarizing magnetic field is perpendicular to the magnetic field lines of the HF field formed by the signal in phase-opposition and parallel to the magnetic field lines of the HF field formed by the signal which is in phase. It is to be noted that the input signal which is odd cannot couple, because this signal is situated outside the band of the filter.

The device according to the invention can also be used as a multiple converter in so-termed IC television tuners. The selective uncoupling of the input signal to the intermediate frequency is then optimum. The direct coupling of the filter results in an optimum bandwidth and a very simple construction.

It is to be noted that the diode ring mixer can also be realized using a gyromagnetic filter having only one YIG sphere. In that case the coupling line 19 and the coupling body 18 are omitted in the circuit as shown in FIG. 2, and the line pair 13, 14 is arranged in a plane perpendicular to the line pair 11, 12 and parallel to the polarizing magnetic field $H_a$ such that the loop 21 is situated in a symmetry plane of the coupling body 17.

What is claimed is:

1. A diode ring mixer comprising four diodes which are series connected in a closed ring, a first pair of conductors connected to two non-adjacent junctions of the diodes to apply thereto an input signal, a first local oscillator, a second pair of conductors symmetrically connected between the other two junctions and said first oscillator, a ferromagnetic filter including a body of a high-frequency gyromagnetic material, said second pair of conductors being coupled to said body and symmetrically arranged in a first plane of symmetry of said body, said body being magnetically prepolarized parallel to a plane through the second pair of conductors and perpendicular to said first plane of symmetry, the intensity of prepolarization being such that magnetic resonance occurs in the material, and an output line including two output conductors forming a loop magnetically coupled to said body and symmetrically arranged in a second plane of symmetry of said body perpendicular to said first plane of symmetry.

2. A diode ring mixer comprising an input ring of four diodes, an output ring of four diodes, input terminals connected to two non-adjacent junctions of the diodes in said input ring, output terminals connected to two non-adjacent junctions of the diodes in said output ring, two pairs of first conductors connected, respectively, to the other non-adjacent junctions of said rings, said first conductors being arranged in a first plane, a ferromagnetic filter including two bodies of high frequency gyromagnetic material symmetrically arranged in said first plane between the pairs of said first conductors, two local oscillators each connected to an assigned pair of the first conductors, said gyromagnetic bodies being magnetically prepolarized in a second plane perpendicular to said first plane and with such an intensity that magnetic resonance occurs in the material, a pair of second conductors arranged in said second plane parallel to the direction of prepolarization and perpendicular to said first plane, said second conductors being magnetically coupled to said gyromagnetic bodies.

* * * * *